(12) United States Patent
Kumashikar et al.

(10) Patent No.: US 12,431,899 B2
(45) Date of Patent: Sep. 30, 2025

(54) SELF-GATING FLOPS FOR DYNAMIC POWER REDUCTION

(71) Applicant: Intel Corporation, Santa Clara, CA (US)

(72) Inventors: Mahesh K. Kumashikar, Bangalore (IN); Md Altaf Hossain, Portland, OR (US); Yuet Li, Fremont, CA (US); Atul Maheshwari, Portland, OR (US); Ankireddy Nalamalpu, Portland, OR (US)

( * ) Notice: Subject to any disclaimer, the term of this patent is extended or adjusted under 35 U.S.C. 154(b) by 767 days.

(21) Appl. No.: 17/559,350

(22) Filed: Dec. 22, 2021

(65) Prior Publication Data

US 2022/0116038 A1   Apr. 14, 2022

(51) Int. Cl.
*H03K 19/00* (2006.01)

(52) U.S. Cl.
CPC ..... *H03K 19/0016* (2013.01); *H03K 19/0013* (2013.01)

(58) Field of Classification Search
CPC ........... H03K 19/0016; H03K 19/1774; H03K 19/17708; H03K 5/15; G06F 17/505; G06F 17/50
See application file for complete search history.

(56) References Cited

U.S. PATENT DOCUMENTS

| | | | | |
|---|---|---|---|---|
| 5,883,529 A * | 3/1999 | Kumata | ..................... | G06F 1/06 326/98 |
| 7,068,080 B1 * | 6/2006 | Sanders | ................. | H03K 3/012 327/544 |
| 7,639,057 B1 * | 12/2009 | Su | ............................. | G06F 1/10 326/97 |
| 9,362,910 B2 * | 6/2016 | Gurumurthy | ...... | H03K 19/0016 |
| 9,966,953 B2 * | 5/2018 | Ye | ....................... | H03K 19/0016 |
| 10,454,457 B1 * | 10/2019 | Mathuria | ....... | G01R 31/318541 |
| 2007/0210833 A1 * | 9/2007 | Hamdan | ................... | G06F 1/10 326/93 |
| 2010/0277219 A1 * | 11/2010 | Campbell | .......... | H03K 19/0016 327/434 |
| 2012/0286824 A1 * | 11/2012 | Myers | ................ | H03K 19/0016 716/119 |
| 2015/0200652 A1 * | 7/2015 | Berzins | ................ | H03K 3/0372 327/225 |
| 2015/0200669 A1 * | 7/2015 | Cai | ..................... | H03K 19/0016 327/225 |
| 2016/0049937 A1 * | 2/2016 | Tong | .................. | H03K 19/0016 327/199 |
| 2017/0170829 A1 * | 6/2017 | Liu | ..................... | H03K 19/0016 |
| 2018/0123568 A1 * | 5/2018 | Rasouli | .................. | H03K 3/012 |
| 2022/0026945 A1 * | 1/2022 | Shamanna | ................ | G06F 1/10 |
| 2022/0166427 A1 * | 5/2022 | Hwang | .............. | H03K 17/6871 |

* cited by examiner

Primary Examiner — Tuan T Lam
(74) Attorney, Agent, or Firm — Haley Guiliano LLP (57) ABSTRACT

Systems or methods described herein may relate to latch-independent clock gating techniques to enable or disable an internal clock of an integrated circuit device. A programmable logic device includes a clock gating circuit that receives a clock signal and is latch independent. The clock gating circuit includes gating signal circuitry that generates a gating signal based on the clock signal and an enable signal. The clock gating circuit also includes a logic gate that generates a control signal based on the gating signal. The clock gating circuit also includes gated clock generation circuitry that generates a gated clock signal based on the clock signal and the control signal.

13 Claims, 10 Drawing Sheets

FIG. 10 sure, Accordingly, it may be understood that these statements are to be read in this light, and not as admissions of prior art.

SELF-GATING FLOPS FOR DYNAMIC POWER REDUCTION

BACKGROUND

The present disclosure relates generally to integrated circuit (IC) devices such as programmable logic devices (PLDs). More particularly, the present disclosure relates to techniques for dynamic power reduction for an integrated circuit device, such as a field programmable gate array (FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are found in a wide variety of products, including computers, handheld devices, industrial infrastructure, televisions, and vehicles. Many of these integrated circuit devices are application-specific integrated circuit (ASICs) that are designed and manufactured to perform specific tasks. A programmable logic device such as an FPGA, by contrast, may be configured after manufacturing with a variety of different system designs. As such, programmable logic devices may be used for varying tasks and/or workloads. However, increases in operating frequencies and/or higher performance computations may result in greater dynamic power consumption for programmable logic devices.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Programmable logic devices are increasingly permeating markets and are increasingly enabling customers to implement circuit designs in logic fabric (e.g., programmable logic). Programmable logic fabric of an integrated circuit device may be programmed to implement a programmable circuit design to perform a wide range of functions and operations. The programmable logic fabric may include configurable blocks of programmable logic (e.g., sometimes referred to as logic array blocks (LABs) or configurable logic blocks (CLBs)) that have lookup tables (LUTs) that can be configured to operate as different logic elements based on the configuration data programmed into memory cells in the blocks.

Integrated circuit devices may employ clock gating to enable or disable an internal clock of an integrated circuit device. By disabling the clock signal when the integrated circuit device is not in use, clock gating techniques may disable components of the integrated circuit device. For example, any number of flip-flops may be disabled to prevent the flip-flops from switching states and consuming dynamic power. Clock gating techniques may utilize additional clock gating circuit to generate gating signals to enable and disable the internal clock. However, the clock gating circuit may take up valuable space on the integrated circuit device. Moreover, timing delays may result from the signals passing through the clock gating circuit. Fine-level clock gating (e.g., each component includes a corresponding clock gating circuit) techniques may utilize significant portions of the integrated circuit device for the clock gating circuit. By employing coarse-level clock gating (e.g., a single gating signal for 16, 32, 64 flip-flops, or more) techniques, the area taken up by the clock gating circuit may be reduced as a single instance of a clock gating circuit may disable multiple components. However, coarse level clock gating may be inefficient in disabling components when multiple components corresponding to the clock gating circuit are not in use since the clock gating is not applied or operations may be negatively impacted.

Figure 1:
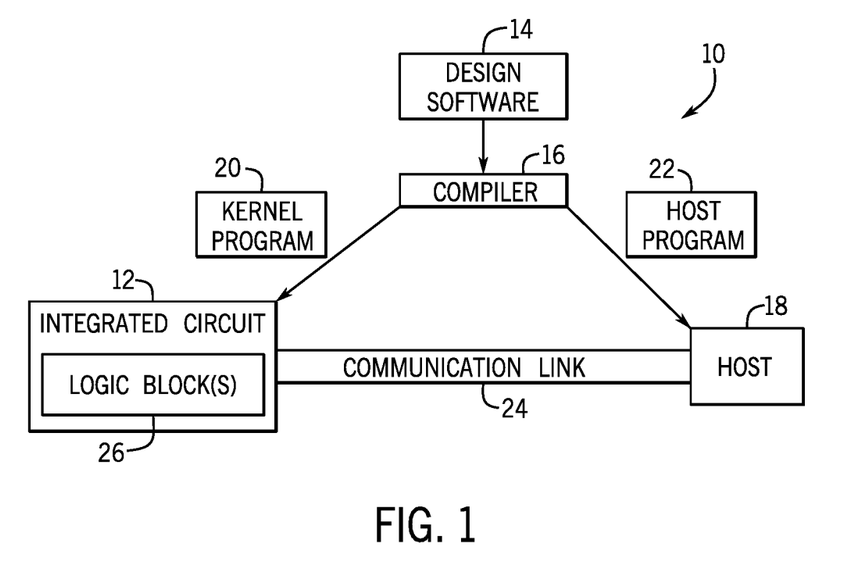
FIG. 1 is a block diagram of a system that may implement arithmetic operations using an integrated circuit device, in accordance with an embodiment of the present disclosure.

With the foregoing in mind, FIG. 1 illustrates a block diagram of a system 10 that may perform operations as described herein. A designer may desire to implement functionality, such as the operations of this disclosure, or an application involving operations on an integrated circuit device 12 (such as a field programmable gate array (FPGA)). The integrated circuit device 12 may implement a programmable system design to carry out the desired functionality. In some cases, the designer may specify a high-level program, such as an OPENCL® program, which may enable the designer to more efficiently and easily provide programming instructions to configure a set of programmable logic cells for the integrated circuit device 12 without requiring specific knowledge of low-level hardware description languages (e.g., Verilog or VHDL). For example, because OPENCL® is quite similar to other high-level programming languages, such as C++, designers of programmable logic familiar with such programming languages may have a reduced learning curve than designers that may have to learn unfamiliar low-level hardware description languages to implement new functionalities in the integrated circuit device 12.

Designers may implement their high-level designs using design software 14, such as a version of INTEL® QUARTUS® by INTEL CORPORATION. The design software 14 may use a compiler 16 to convert the high-level program into a lower-level description. The design software 14 may also be used to optimize and/or increase efficiency in the design. The compiler 16 may provide machine-readable instructions representative of the high-level program to a host 18 and the integrated circuit device 12. The host 18 may receive a host program 22, which may be implemented by kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of one or more logic blocks 26 on the integrated circuit device 12. The logic block 26 may include circuitry and/or other logic elements and may be configured to implement arithmetic operations, such as addition and multiplication. The integrated circuit device 12 may include many (e.g., hundreds or thousands) of the logic blocks 26. Additionally, logic blocks 26 may be communicatively coupled to another such that data outputted from one logic block 25 may be provided to other logic blocks 26.

The designer may use the design software 14 to generate and/or to specify a low-level program, such as the low-level hardware description languages described above. Further, in some embodiments, the system may be implemented without a separate host program. Moreover, in some embodiments, the techniques described herein may be implemented in circuitry as a non-programmable circuit design. Thus, embodiments described herein are intended to be illustrative and not limiting.

Figure 2:
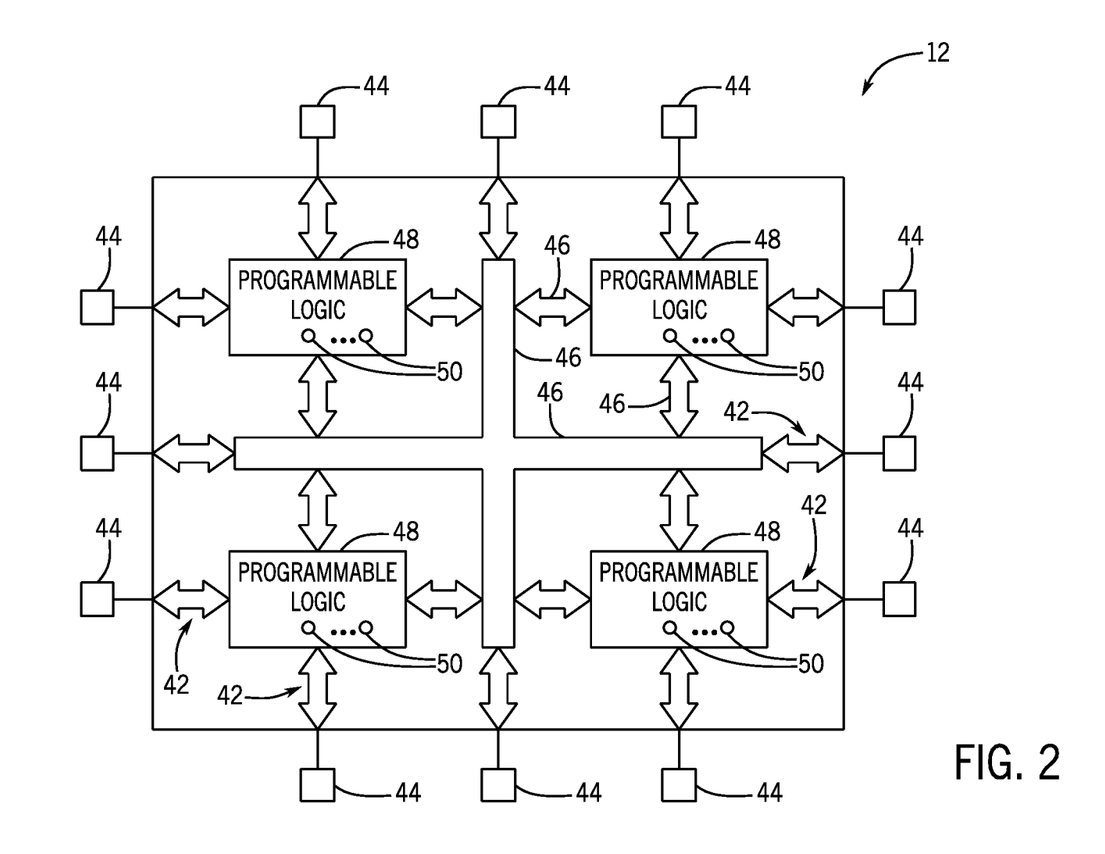
FIG. 2 is a block diagram of the integrated circuit device of FIG. 1, in accordance with an embodiment of the present disclosure.

Turning now to a more detailed discussion of the integrated circuit device 12, FIG. 2 illustrates a block diagram of the integrated circuit device 12 that may be a programmable logic device, such as an FPGA. Further it should be understood that the integrated circuit device 12 may be any other suitable type of programmable logic device (e.g., an application-specific integrated circuit and/or application-specific standard product). Additionally or alternatively, the integrated circuit device 12 may be any suitable integrated circuit device. In certain embodiments, the integrated circuit device 12 may not be a programmable logic device. As shown, the integrated circuit device 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on the integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configurable to perform a custom logic function. The programmable interconnects associated with interconnection resources may be considered to be a part of programmable logic 48. The programmable logic 48 may include multiple various types of programmable logic 48 of different tiers of programmability. For example, the programmable logic 48 may include various mathematical logic units, such as an arithmetic logic unit (ALU) or configurable logic block (CLB) that may be configurable to perform various mathematical functions (e.g., addition, multiplication, and so forth).

Programmable logic devices, such as integrated circuit device 12, may contain programmable elements 50, such as configuration random-access-memory (CRAM) cells loaded with configuration data during programming and look-up table random-access-memory (LUTRAM) cells that may store either configuration data or user data, within the programmable logic 48. For example, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
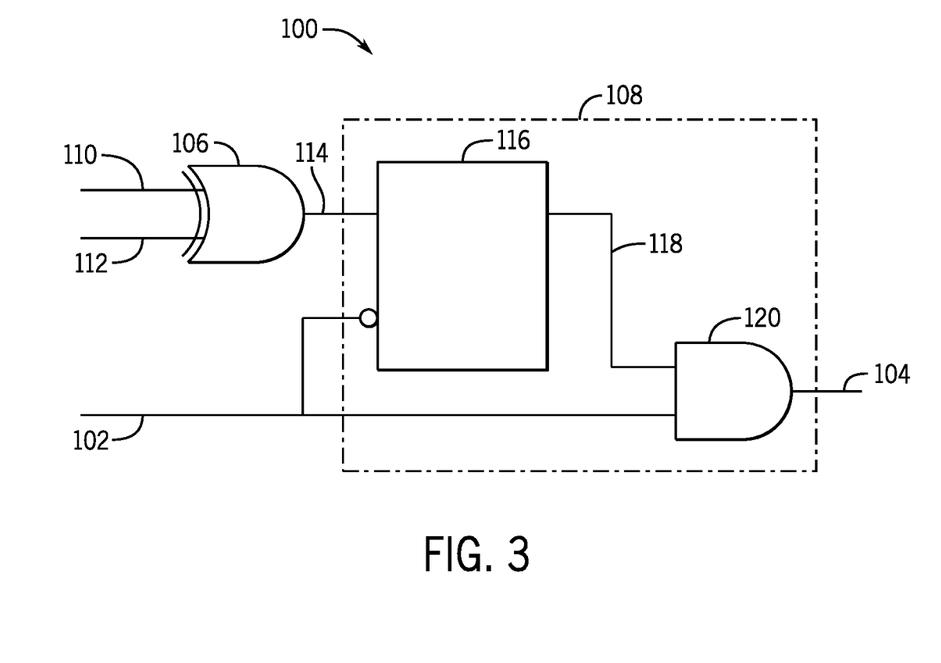
FIG. 3 is a block diagram of a clock gating circuit, in accordance with an embodiment of the present disclosure.

Latch-based clock gating techniques may utilize a latch to hold an enable signal beginning with an active (e.g., enabled) edge of the clock and ending with an inactive (e.g., disabled) edge of the clock. The latch outputs a control signal that controls generation of the gated clock signal. FIG. 3 is a block diagram of an example embodiment of a clock gating circuit 100 that may receive a clock signal 102 and output a gated clock signal 104, in accordance with an embodiment of the present disclosure. The clock gating circuit 100 may include any number of components, such as gating signal circuitry 106 and gated clock generation circuitry 108. The gating signal circuitry 106 may receive an enable signal 110 and a test enable signal 112 and may generate a gating signal 114 based on the enable signal 110 and the test enable signal 112. In certain embodiments, the gating signal circuitry 106 may include any number of circuit components, such as an OR gate and/or an exclusive OR (e.g., XOR) gate. The OR gate may receive the enable signal 110 at a first input terminal and the test enable signal 112 at a second input terminal. As such, the gating signal 114 may be high when either the enable signal 110 and/or the test enable signal 112 is high. The gated clock generation circuitry 108 may include a latch 116 that receives the gating signal 114 at a data terminal and the clock signal 102 at a clock terminal. The latch 116 may output a control signal 118 that controls generation of the gated clock signal 104. The gated clock generation circuitry 108 may also include a logic gate, such as AND gate 120. The AND gate 120 may receive the control signal 118 at a first input terminal and the clock signal 102 at a second input terminal. As such, the AND gate 120 may output the gated clock signal 104 based on ANDing of the clock signal 102 and the control signal 118.

During operation of the clock gating circuit 100, the clock signal 102 may be low (e.g., 0 volts) at a first time. As such, the AND gate 120 may receive the clock signal 102 and output the gated clock signal 104 as low due to one of the input terminals of the AND gate 120 receiving a low signal. When the clock signal 102 goes low (e.g., 0 volts), the latch 116 latch the state of the gating signal 114 as the control signal 118. The latch 116 hold the state of the control signal 118 until the clock signal 102 transitions low again. When the control signal 118 is high, the AND gate 120 may receive high signals from both the clock signal 102 and the control signal 118. Accordingly, when the control signal 118 is asserted, the AND gate 120 may output the gated clock signal 104 that is a copy of the clock signal 102. When the control signal 118 is low, the AND gate 120 may cause the gated clock signal 104 to be deasserted regardless of the status of clock signal 102. In other words, the control signal 116 gates the clock signal 102.

Figure 4:
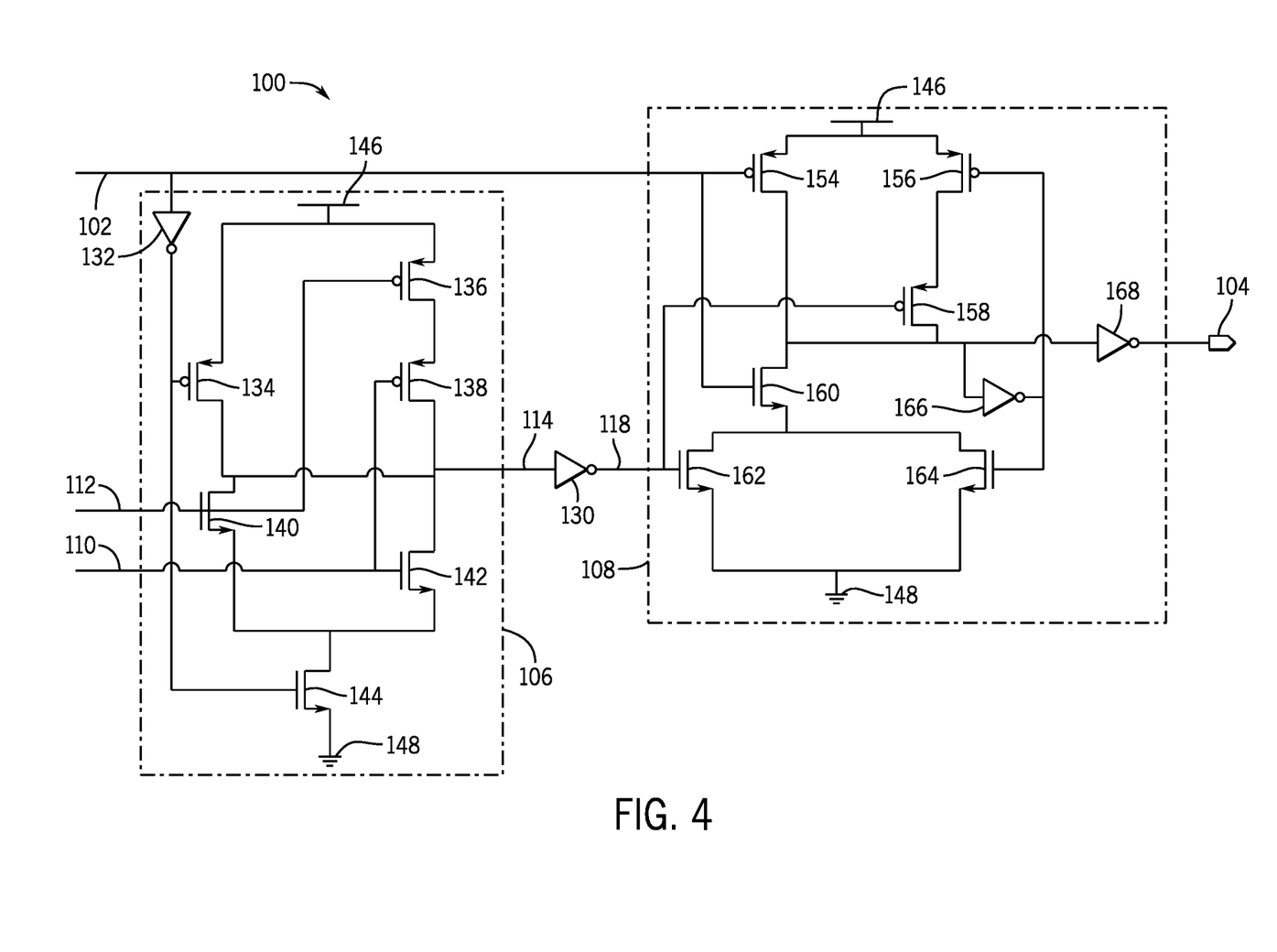
FIG. 4 is a schematic diagram of another embodiment of a clock gating circuit, in accordance with an embodiment of the present disclosure.

However, latch-based clock gating techniques may utilize a relatively large space on the integrated circuit device 12 for implementation of the latch circuitry. Additionally, such techniques may introduce timing delays from the propagation of the clock signal through the latch circuitry. FIG. 4 is a schematic diagram of an example embodiment of the clock gating circuit 100 that may generate the gated clock signal 104, in accordance with an embodiment of the present disclosure. The clock gating circuit 100 of FIG. 4 may be latch independent. That is, the clock gating circuit 100 of FIG. 4 may not include an explicit latch (e.g., the latch 116). The clock gating circuit 100 may include the gating signal circuitry 106, a logic gate 130, such as an inverter, and the gated clock generation circuitry 108.

The gating signal circuitry 106 may receive the enable signal 110, the test enable signal 112, and the clock signal 102 as inputs and may generate the gating signal 114. As shown, the gating signal circuitry 106 may include any number of circuit components, such as an inverter 132, P-channel metal-oxide-semiconductor (PMOS) transistors 134, 136, and 138, and N-channel metal-oxide-semiconductor (NMOS) transistors 140, 142, and 144. The inverter 132 may receive the clock signal 102 at an input terminal and output an inverted clock signal to a gate terminal of the PMOS transistor 134 and a gate terminal of the NMOS transistor 144. A source terminal of the PMOS transistor 134 and a source terminal of the PMOS transistor 136 may be tied to a power supply 146. A drain terminal of the PMOS transistor 134, a drain terminal of the PMOS transistor 138, a drain terminal of the NMOS transistor 140, and a drain terminal of the NMOS transistor 142 may be coupled to an input terminal of the logic gate 130. A gate terminal of the PMOS transistor 136 and a gate terminal of the NMOS transistor 140 may be coupled to the test enable signal 112. A drain terminal of the PMOS transistor 136 may be coupled to a source terminal of the PMOS transistor 138. A gate terminal of the PMOS transistor 138 and a gate terminal of the NMOS transistor 142 may be tied to the enable signal 110. A source terminal of the NMOS transistor 140 and a source terminal of the NMOS transistor 142 may be coupled to a drain terminal of the NMOS transistor 144. A source terminal of the NMOS transistor 144 may be coupled to ground 148 (e.g., 0 volts). In certain embodiments, the gating signal circuitry 106 may include additional components, such as the logic gate 130. Additionally or alternatively, the gating signal circuitry 106 may correspond to an OR gate and/or an XOR gate. That is, the gating signal circuitry 106 may function as an OR gate or an XOR gate based on the enable signal 110, the test enable signal 112, and/or the clock signal 102. While the logic gate 130 shown in FIG. 4 includes an inverter, any number of logic gates 130 and/or any type of logic gates 130 may be utilized in the clock gating circuit 100. Thus, the embodiment shown in FIG. 4 is intended to be illustrative and not limiting.

The input terminal of the logic gate 130 may receive the gating signal 114 from the gating signal circuitry 106 and may generate the control signal 118 for the gated clock generation circuitry 108. The control signal 118 may control operation of the gated clock generation circuitry 108. The gated clock generation circuitry 108 may generate the gated clock signal 104. In certain embodiments, the gated clock generation circuitry 108 may be latch independent. The gated clock generation circuitry 108 may include any number of circuit components, such as PMOS transistors 154, 156, and 158, NMOS transistors 160, 162, 164, and inverters 166, 168. The gated clock generation circuitry 108 may receive the control signal 118 and the clock signal 102. A gate terminal of the PMOS transistor 154 and a gate terminal of the NMOS transistor 160 may be tied to the clock signal 102. A source terminal of the PMOS transistor 154 and a source terminal of the PMOS transistor 156 may be tied to the power supply 146. A drain terminal of the PMOS transistor 154, a drain terminal of the PMOS transistor 158 and a drain terminal of the NMOS transistor 160 may be coupled to an input terminal of the inverter 166 and an input terminal of the inverter 168. A gate terminal of the PMOS transistor 156 and a gate terminal of the NMOS transistor 164 may be coupled to an output of the inverter 166. A drain terminal of the PMOS transistor 156 may be coupled to a source terminal of the PMOS transistor 158. A gate terminal of the PMOS transistor 158 and a gate terminal of the NMOS transistor 162 may be tied to the control signal 118. A source terminal of the NMOS transistor 160 may be coupled to a drain terminal of the NMOS transistor 162 and a drain terminal of the NMOS transistor 164. A source terminal of the NMOS transistor 162 and a source terminal of the NMOS transistor 164 may be coupled to ground 148.

Figure 5:
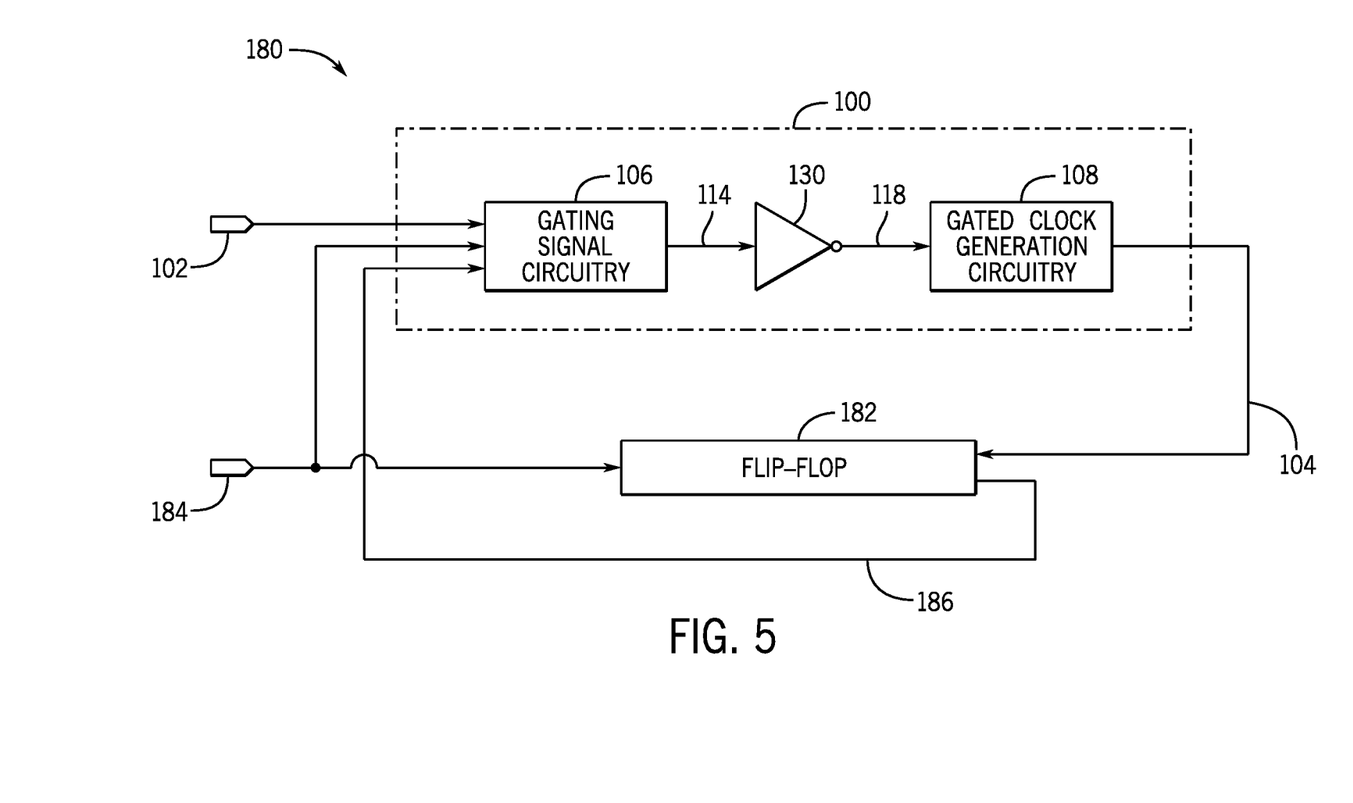
FIG. 5 is a block diagram of a self-gating flip-flop circuit including another embodiment of a clock gating circuit, in accordance with an embodiment of the present disclosure.

The gated clock signal 104 may be utilized to enable and/or disable flip-flops on the integrated circuit device 12. As such, the gated clock signal 104 may reduce dynamic power consumption of the integrated circuit device 12 by preventing the flip-flops from switching states and thereby utilizing power when not in use. The flip-flops may be self-gating. That is, a corresponding input signal of a flip-flop may be used to determine when to enable and/or disable the flip-flop on the integrated circuit device 12. With the foregoing in mind, FIG. 5 is a block diagram of a self-gating flip-flop circuit 180 including another example embodiment of the clock gating circuit 100 that generates the gated clock signal 104. The self-gating flip-flop circuit 180 may include the clock gating circuit 100 and a flip-flop 182. The clock gating circuit 100 may output the gated clock signal 104 to control operation of the flip-flop 182. The flip-flop 182 may receive a flip-flop input signal 184 at an input terminal and may output a flip-flop output signal 186. The gating signal circuitry 106 may receive the clock signal 102, the flip-flop input signal 184, and the flip-flop output signal 186 and may generate the gating signal 114. The logic gate 130 may receive the gating signal 114 and may generate the control signal 118 as output. The gated clock generation circuitry 108 may receive the control signal 118 and the clock signal 102. As such, the gated clock generation circuitry 108 may output the gated clock signal 104 to control operation of the flip-flop 182. The flip-flop 182 may receive the gated clock signal 104 at a clock terminal and the gated clock signal 104 may disable (e.g., prevent the flip-flop 182 from switching states) when the flip-flop 182 when the gated clock signal 104 is gated/suppressed due to the control signal 118 being deasserted and may enable the flip-flop 182 to toggle when the gated clock signal 104 toggles freely due to the control signal 118 being asserted.

Figure 6:
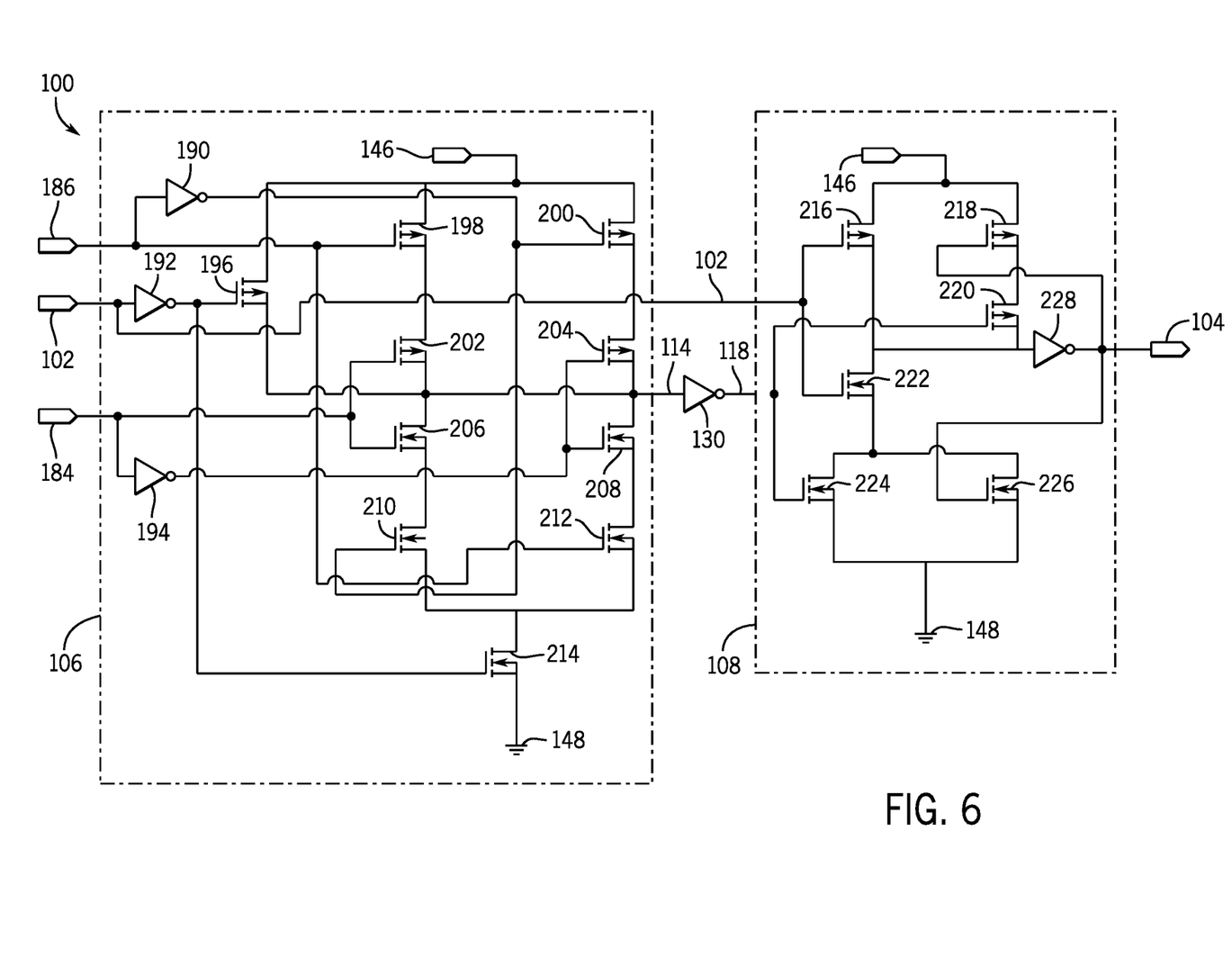
FIG. 6 is a schematic diagram of the clock gating circuit of FIG. 5, in accordance with an embodiment of the present disclosure.

With the foregoing in mind, FIG. 6 is a schematic diagram of an example embodiment of the clock gating circuit 100 of FIG. 5 that may generate the gated clock signal 104, in accordance with an embodiment of the present disclosure. The clock gating circuit 100 of FIG. 6 may be latch independent. The clock gating circuit 100 may include the gating signal circuitry 106, the logic gate 130, and the gated clock generation circuitry 108. The clock gating circuit 100 of FIG. 6 may be utilized in the self-gating flip-flop circuit 180. For example, the clock-gating circuit 100 may be used to control when to enable and/or disable toggling of the flip-flop 182 based on the flip-flop input signal 184 and/or the flip-flop output signal 186.

As shown, the gating signal circuitry 106 may include any number of circuit components, such as inverters 190, 192, and 194, PMOS transistors 196, 198, 200, 202, and 204, and NMOS transistors 206, 208, 210, 212, and 214. An input terminal of the inverter 190, a gate terminal of the PMOS transistor 198, and a gate terminal of the NMOS transistor 212 may be tied to the flip-flop output signal 186. An output of the inverter 190 may be coupled to a gate terminal of the PMOS transistor 200 and a gate terminal of the NMOS transistor 210. An input terminal of the inverter 192 may be tied to the clock signal 102. An output terminal of the inverter 192 may be coupled to a gate terminal of the PMOS transistor 196 and a gate terminal of the NMOS transistor 214. An input terminal of the inverter 194, a gate terminal of the PMOS transistor 202, and a gate terminal of the NMOS transistor 206 may be tied to the flip-flop input signal 184.

An output terminal of the inverter 194 may be coupled to a gate terminal of the PMOS transistor 204 and a gate terminal of the NMOS transistor 208. A drain terminal of the PMOS transistor 196, a drain terminal of the PMOS transistor 198, and a drain terminal of the PMOS transistor 200 may be tied to the power supply 146. A source terminal of the PMOS transistor 196, a source terminal of the PMOS transistor 202, a source terminal of the PMOS transistor 204, a drain terminal of the NMOS transistor 206, and a drain terminal of the NMOS transistor 208 may be coupled to an input terminal of the logic gate 130. A source terminal of the PMOS transistor 198 may be coupled to a drain terminal of the PMOS transistor 202. A source terminal of the PMOS transistor 200 may be coupled to a drain terminal of the PMOS transistor 204. A source terminal of the NMOS transistor 206 may be coupled to a drain terminal of the NMOS transistor 210. A source terminal of the NMOS transistor 208 may be coupled to a drain terminal of the NMOS transistor 212. A source terminal of the NMOS transistor 210 and a source terminal of the NMOS transistor 212 may be coupled to a drain terminal of the NMOS transistor 214. A source terminal of the NMOS transistor 214 may be coupled to ground 148. Additionally or alternatively, the gating signal circuitry 106 may correspond to an OR gate and/or an XOR gate. That is, the gating signal circuitry 106 may function as an OR gate or an XOR gate based on the flip-flop input signal 184, the flip-flop output signal 186, and/or the clock signal 102. While the logic gate 130 shown in FIG. 6 includes an inverter, any number of logic gates 130 and/or any type of logic gates 130 may be utilized in the clock gating circuit 100. Thus, the embodiment shown in FIG. 6 is intended to be illustrative and not limiting.

The gated clock generation circuitry 108 may generate the gated clock signal 104 based on the clock signal 102 and the control signal 118. In certain embodiments, the gated clock generation circuitry 108 may be latch independent. The gated clock generation circuitry 108 may include any number of circuit components, such as PMOS transistors 216, 218, and 220, NMOS transistors 222, 224, and 226, and inverter 228. A gate terminal of the PMOS transistor 216 and a gate terminal of the NMOS transistor 222 may be tied to the clock signal 102. A drain terminal of the PMOS transistor 216 and a drain terminal of the PMOS transistor 218 may be tied to the power supply 146. A source terminal of the PMOS transistor 216, a source terminal of the PMOS transistor 220, and a drain terminal of the NMOS transistor 222 may be coupled to an input terminal of the inverter 228. A gate terminal of the PMOS transistor 218 and a gate terminal of the NMOS transistor 226 may be coupled to an output (e.g., gated clock signal 104) of the inverter 228. A source terminal of the PMOS transistor 218 may be coupled to a drain terminal of the PMOS transistor 220. A gate terminal of the PMOS transistor 220 and a gate terminal of the NMOS transistor 224 may be tied to the output (e.g., the control signal 118) of the logic gate 130. A source terminal of the NMOS transistor 222 may be coupled to a drain terminal of the NMOS transistor 224 and a drain terminal of the NMOS transistor 226. A source terminal of the NMOS transistor 224 and a source terminal of the NMOS transistor 226 may be coupled to ground 148.

Figure 7:
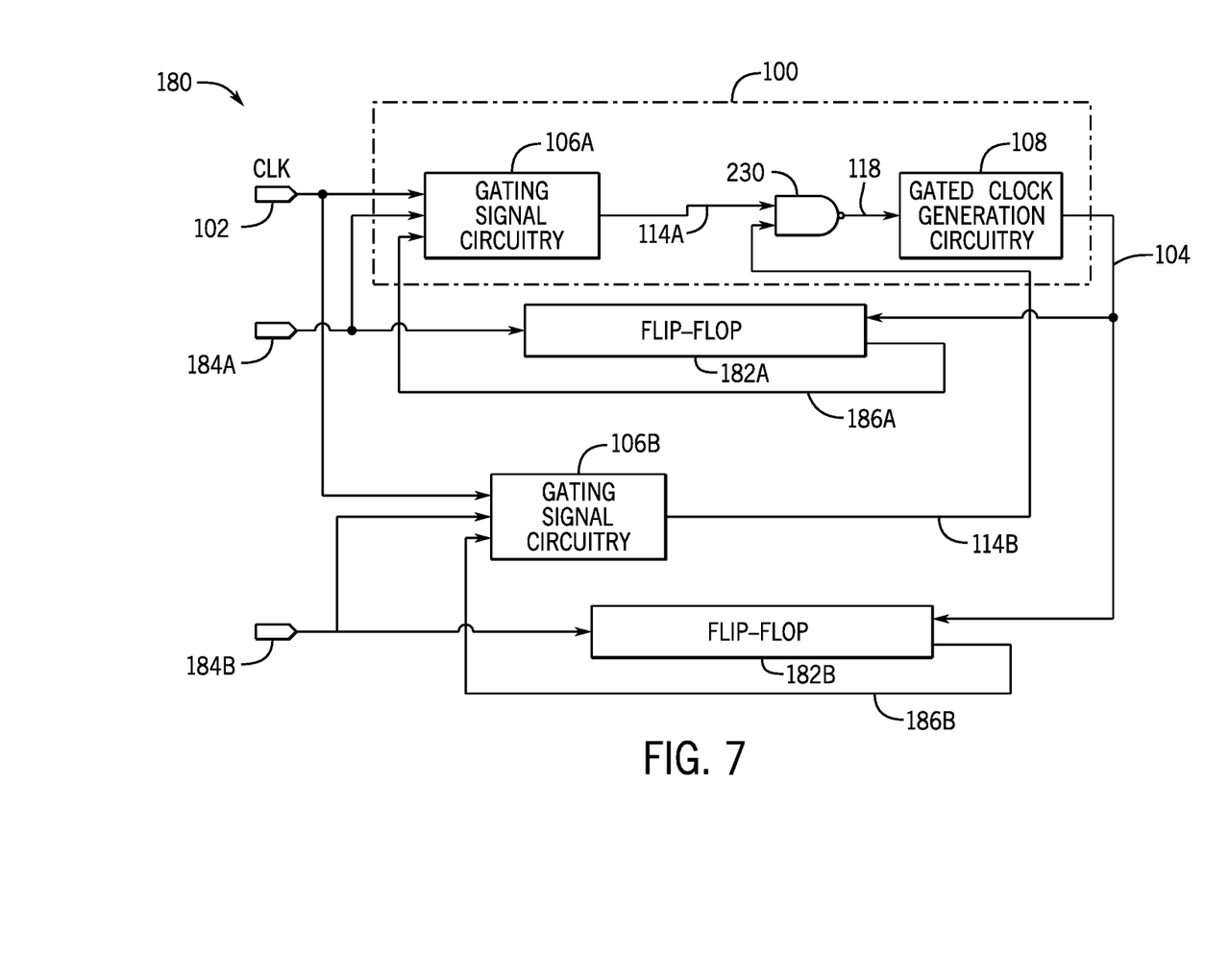
FIG. 7 is a block diagram of a self-gating flip-flop circuit having multiple flip-flops, in accordance with an embodiment of the present disclosure.

In certain embodiments, the gated clock signal 104 may be utilized to enable and/or disable toggling of any number of flip-flops on the integrated circuit device 12. As such, the gated clock signal 104 may reduce dynamic power consumption of the integrated circuit device 12 by preventing the flip-flops from switching states and thereby utilizing power when not in use. With the foregoing in mind, FIG. 7 is a block diagram of another embodiment of the self-gating flip-flop circuit 180. The self-gating flip-flop circuit 180 may include the clock gating circuit 100, a first flip-flop 182A, and a second flip-flop 182B. The clock gating circuit 100 may output the gated clock signal 104 to control operation of the flip-flops 182A, 182B. In some embodiments, the clock gating circuit 100 may include the first gating signal circuitry 106A, the gated clock generation circuitry 108, and the logic gate 130. Additionally or alternatively, the clock gating circuit 100 may include the second gating signal circuitry 106B. The first flip-flop 182A may receive a first flip-flop input signal 184A at an input terminal and may output a first flip-flop output signal 186A. The first gating signal circuitry 106A may receive the clock signal 102, the first flip-flop input signal 184A, and the first flip-flop output signal 186A and may generate the first gating signal 114A. The second flip-flop 182B may receive a second flip-flop input signal 184B at an input terminal and may output a second flip-flop output signal 186B. The second gating signal circuitry 106B may receive the clock signal 102, the second flip-flop input signal 184B, and the second flip-flop output signal 186B and may generate the second gating signal 114B.

The logic gate 130 may receive the first gating signal 114A and the second gating signal 114B and may generate the control signal 118 as output. In certain embodiments, the logic gate 130 may include a NAND gate. As such, the NAND gate may only generate the control signal 118 as low when both the first gating signal 114A and the second gating signal 114B are high. Otherwise, the NAND gate generates the control signal 118 as high enabling free running of the gated clock signal 104. The gated clock generation circuitry 108 may receive the control signal 118 and the clock signal 102. As such, the gated clock generation circuitry 108 may output the gated clock signal 104 to control operation of the flip-flops 182A, 182B. The flip-flops 182A, 182B may receive the gated clock signal 104 at a corresponding clock terminal and the gated clock signal 104 may disable the flip-flops 182A, 182B when the gated clock signal 104 is low and may enable the flip-flops 182A, 182B when the gated clock signal 104 is high. While the embodiment of the self-gating flip-flop circuit 180 in FIG. 7 includes two flip-flops, any number of flip-flops (e.g., 2, 4, 8, 16, 32, and so forth) may be utilized with the clock gating circuit 100. Thus, the embodiment shown in FIG. 7 is intended to be illustrative and not limiting. Additionally or alternatively, the gating signal circuitries 106A, 106B may correspond to OR gates and/or XOR gates. That is, the gating signal circuitries 106A, 106B may function as OR gates or XOR gates based on the flip-flop input signals 184A, 184B, the flip-flop output signals 186A, 186B, and/or the clock signal 102. While the logic gate 130 shown in FIG. 7 includes a NAND gate, any number of logic gates 130 and/or any type of logic gates 130 may be utilized in the clock gating circuit 100. Thus, the embodiment shown in FIG. 7 is intended to be illustrative and not limiting.

Figure 8:
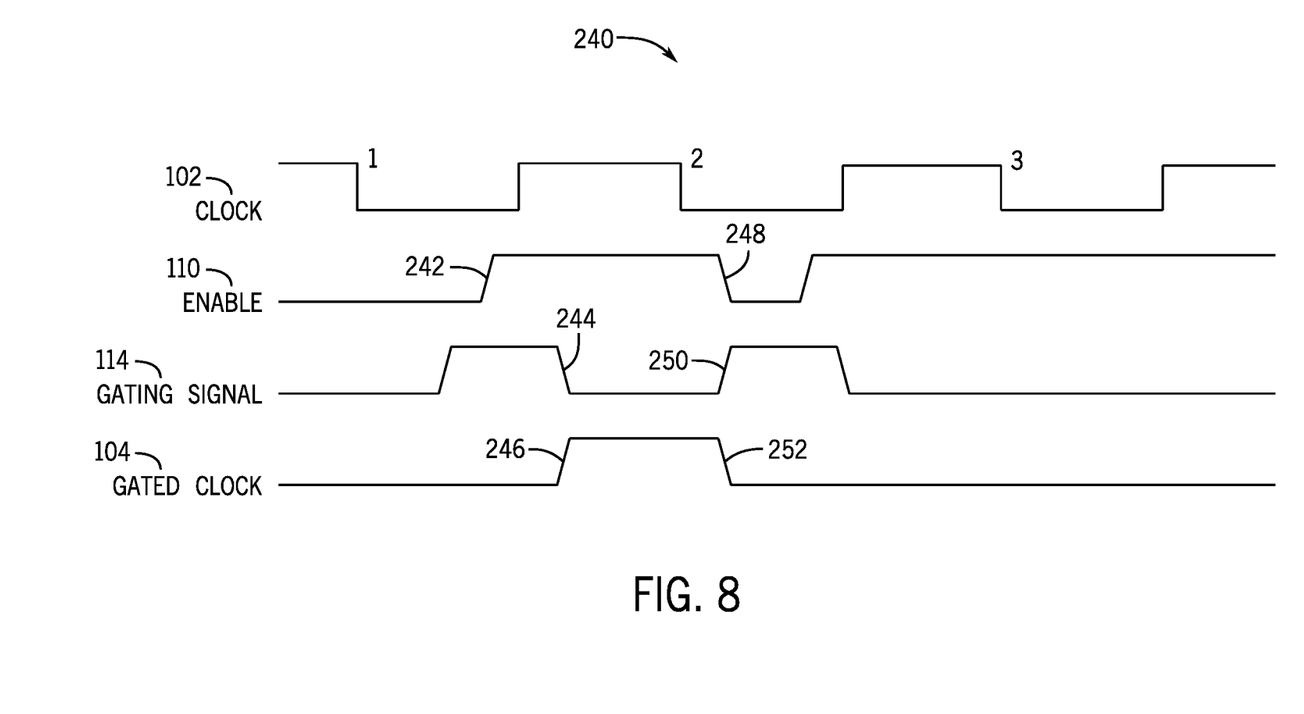
FIG. 8 is a timing diagram of the clock gating circuit of FIG. 4, in accordance with an embodiment of the present disclosure.

With the foregoing in mind, FIG. 8 is a timing diagram 240 of the clock gating circuit 100 of FIG. 4, in accordance with an embodiment of the present disclosure. As shown, a rising edge 242 of the enable signal 110 generates a falling edge 244 of the gating signal 114. For example, the gating signal circuitry 106 may receive the rising edge 242 of the enable signal 110 and output the falling edge 244 of the gating signal 114. The falling edge 244 of the gating signal 114 generates a corresponding rising edge of the control signal 118 after passing through the inverter 130 of FIG. 4. Accordingly, the clock signal 102 and the control signal 118 are high and a rising edge 246 of the gated clock signal 104 is generated. For example, the gated clock generation circuitry 108 may receive the clock signal 102 and the control signal 118 and generate the rising edge 246 of the gated clock signal 104. A falling edge 248 of the enable signal 110 may be received by the gating signal circuitry 106 of FIG. 4. The gating signal circuitry 106 may output a corresponding rising edge 250 of the gating signal 114. As such, the inverter 130 may output a falling edge of the control signal 118 and the gated clock generation circuitry 108 may receive the falling edge of the control signal 118. Accordingly, the gated clock generation circuitry 108 may output a falling edge 252 of the gated clock signal 104. Additionally or alternatively, the falling edge 252 may be attributable to a falling edge of the clock 102 (after some propagation delay through the gating circuitry).

Figure 9:
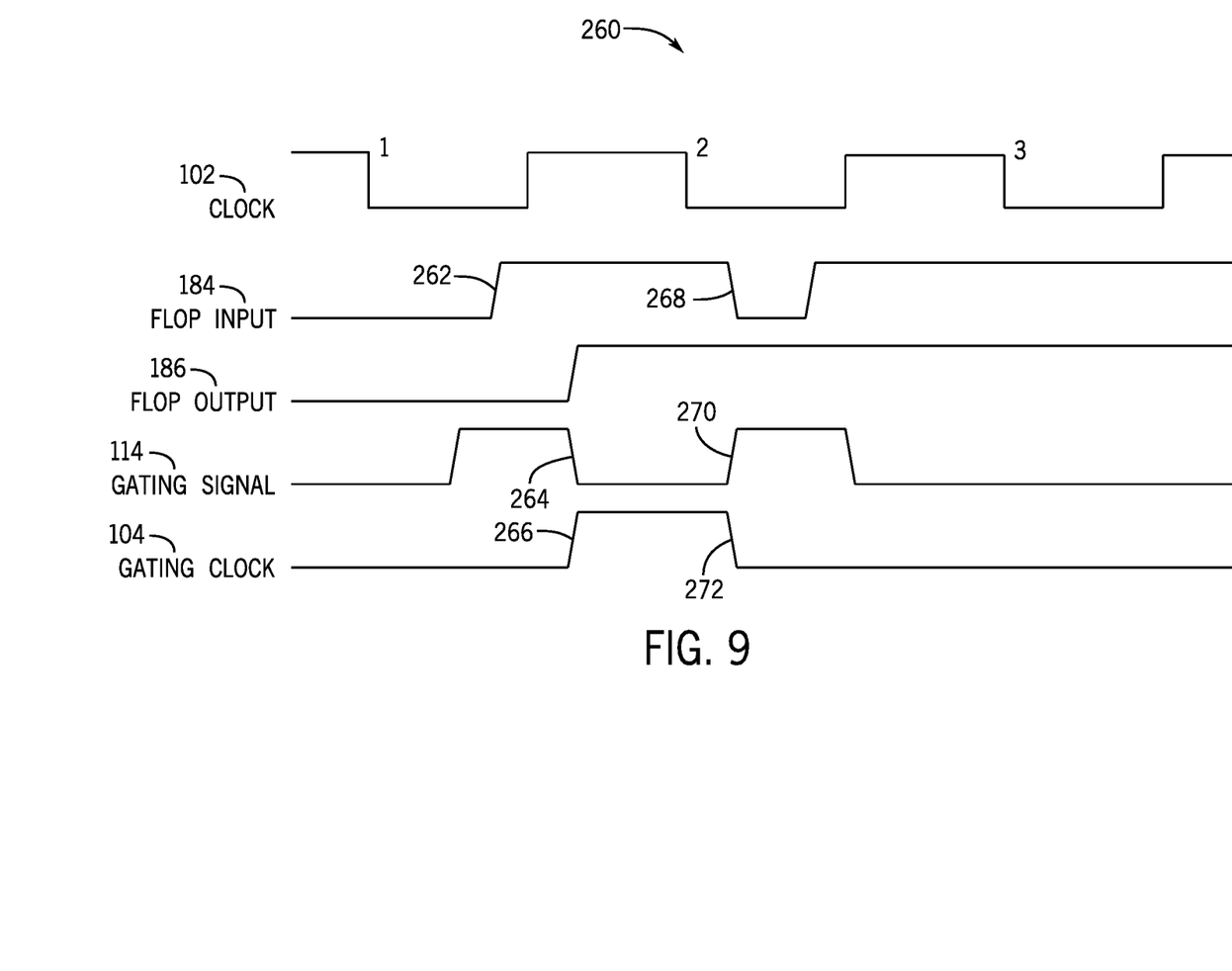
FIG. 9 is a timing diagram of the clock gating circuit of FIG. 6, in accordance with an embodiment of the present disclosure.

FIG. 9 is a timing diagram 260 of the clock gating circuit 100 of FIG. 6, in accordance with an embodiment of the present disclosure. As shown, a rising edge 262 of the flip-flop input signal 184 generates a falling edge 264 of the gating signal 114. For example, the gating signal circuitry 106 may receive the rising edge 262 of the flip-flop input signal 184 and output the falling edge 264 of the gating signal 114. The falling edge 264 of the gating signal 114 generates a corresponding rising edge of the control signal 118 after passing through the inverter 130 of FIG. 6. Accordingly, the clock signal 102 and the control signal 118 are high and a rising edge 266 of the gated clock signal 104 is generated. For example, the gated clock generation circuitry 108 may receive the clock signal 102 and the control signal 118 and generate the rising edge 266 of the gated clock signal 104. A falling edge 268 of the flip-flop input signal 184 may be received by the gating signal circuitry 106. The gating signal circuitry 106 may output a corresponding rising edge 270 of the gating signal 114. As such, the inverter 130 may output a falling edge of the control signal 118 and the gated clock generation circuitry 108 may receive the falling edge of the control signal 118. Accordingly, the gated clock generation circuitry 108 may output a falling edge 272 of the gated clock signal 104. Additionally or alternatively, the falling edge 272 may be attributable to a falling edge of the clock 102 (after some propagation delay through the gating circuitry).

The integrated circuit device 12 may be a data processing system or a component included in a data processing system. For example, the integrated circuit device 12 may be a component of a data processing system 280 shown in FIG. 10. The data processing system 280 may include a host processor 282 (e.g., a central-processing unit (CPU)), memory and/or storage circuitry 284, and a network interface 286. The data processing system 280 may include more or fewer components (e.g., electronic display, user interface structures, application specific integrated circuits (ASICs)). The host processor 282 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 280 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 284 may include random access memory (RAM), read-only memory (ROM), one or more hard drives, flash memory, or the like. The memory and/or storage circuitry 284 may hold data to be processed by the data processing system 280. In some cases, the memory and/or storage circuitry 284 may also store configuration programs (bitstreams) for programming the integrated circuit device 12. The network interface 286 may allow the data processing system 280 to communicate with other electronic devices. The data processing system 280 may include several different packages or may be contained within a single package on a single package substrate.

Figure 10:
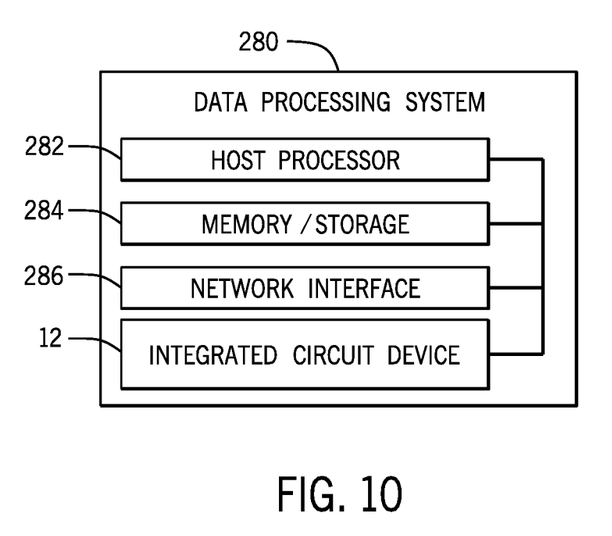
FIG. 10 is a data processing system, in accordance with an embodiment of the present disclosure.

In one example, the data processing system 280 may be part of a data center that processes a variety of different requests. For instance, the data processing system 280 may receive a data processing request via the network interface 286 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include systems and methods that provide gated clock signal generation that is latch independent to reduce timing and area overhead on a programmable logic device. The techniques described herein may benefit operations of programmable logic devices, such as field programmable gate arrays and/or other configurable devices, by improving power efficiency.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. Programmable logic circuitry, comprising:
a plurality of flip-flops that generate a plurality of output signals and that receive a plurality of input signals, wherein the flip-flops of the plurality of flip-flops generate respective output signals of the plurality of output signals based on a gated clock signal and a respective input signal of the plurality of input signals;
a clock gating circuit that receives a clock signal, wherein the clock gating circuit comprises:
a plurality of gating signal circuitries that generate a plurality of gating signals, wherein the gating signal circuitries generate a corresponding gating signal of the plurality of gating signals based on the clock signal, a corresponding input signal, and a corresponding output signal;
a logic gate that generates a control signal based on the plurality of gating signals; and
gated clock generation circuitry that generates the gated clock signal based on the clock signal and the control signal.

2. The programmable logic circuitry of claim 1, wherein the gated clock generation circuitry comprises a plurality of transistors.

3. The programmable logic circuitry of claim 2, wherein the plurality of transistors comprises at least one N-channel metal-oxide-semiconductor (NMOS) transistor and at least one P-channel metal-oxide-semiconductor (PMOS) transistor.

4. The programmable logic circuitry of claim 3, wherein a gate terminal of the at least one NMOS transistor and a gate terminal of the at least one PMOS transistor are coupled to the clock signal.

5. The programmable logic circuitry of claim 3, wherein a gate terminal of the at least one NMOS transistor and a gate terminal of the at least one PMOS transistor are coupled to the control signal.

6. The programmable logic circuitry of claim 1, wherein each gating signal circuitry of the plurality of gating signal circuitries comprises an N-channel metal-oxide-semiconductor (NMOS) transistor, a P-channel metal-oxide-semiconductor (PMOS) transistor, and an inverter.

7. The programmable logic circuitry of claim 6, wherein an input of the inverter is coupled to the clock signal, and a gate terminal of the NMOS transistor and a gate terminal of the PMOS transistor are coupled to an output of the inverter.

8. The programmable logic circuitry of claim 6, wherein a gate terminal of the NMOS transistor and a gate terminal of the PMOS transistor are coupled to the corresponding input signal.

9. The programmable logic circuitry of claim 1, wherein the logic gate is an inverter.

10. The programmable logic circuitry of claim 1, wherein the programmable logic circuitry comprises a field programmable gate array (FPGA).

11. The programmable logic circuitry of claim 6, wherein a gate terminal of the at least one NMOS transistor and a gate terminal of the at least one PMOS transistor are coupled to the corresponding output signal.

12. The programmable logic circuitry of claim 1, wherein the gated clock generation circuitry is latch independent.

13. The programmable logic circuitry of claim 1, wherein the logic gate is a NAND gate.

* * * * *